(12) United States Patent
Peukert

(10) Patent No.: US 7,274,867 B2
(45) Date of Patent: Sep. 25, 2007

(54) SYSTEM AND METHOD FOR DETERMINING THE TEMPERATURE OF A SEMICONDUCTOR WAFER

(75) Inventor: Karsten Peukert, Bannewitz (DE)

(73) Assignee: Infineon Technologies AG, Munich (DE)

( * ) Notice: Subject to any disclaimer, the term of this patent is extended or adjusted under 35 U.S.C. 154(b) by 61 days.

(21) Appl. No.: 10/875,788

(22) Filed: Jun. 25, 2004

(65) Prior Publication Data

US 2005/0042778 A1 Feb. 24, 2005

(30) Foreign Application Priority Data

Jun. 26, 2003 (DE) ............................... 103 28 660

(51) Int. Cl.
*A21B 2/00* (2006.01)
*F26B 19/00* (2006.01)
*F26B 3/30* (2006.01)

(52) U.S. Cl. ..................... 392/416; 392/418; 118/50.1; 118/725; 118/724; 438/123; 219/411

(58) Field of Classification Search ............... 438/123; 219/411, 390, 405, 309; 118/724, 725, 50.1; 392/416, 418
See application file for complete search history.

(56) References Cited

U.S. PATENT DOCUMENTS 4,284,872 A * 8/1981 Graeme ................. 219/121.69
5,539,855 A * 7/1996 Takahashi et al. .......... 392/416
5,567,909 A * 10/1996 Sugarman et al. .......... 136/201
5,716,133 A * 2/1998 Hosokawa et al. ......... 374/121
6,027,244 A * 2/2000 Champetier et al. ........ 374/130
6,056,434 A * 5/2000 Champetier ................. 374/126
6,072,163 A * 6/2000 Armstrong et al. ......... 219/497
6,204,484 B1 * 3/2001 Tay et al. .................... 219/411
6,506,253 B2 * 1/2003 Sakuma ....................... 118/620
6,572,265 B1 * 6/2003 Gotthold et al. ............ 374/161
6,610,968 B1 * 8/2003 Shajii et al. ................. 219/497
6,639,189 B2 * 10/2003 Ramanan et al. ........ 219/444.1
6,649,994 B2 * 11/2003 Parsons ....................... 257/470
6,727,474 B2 * 4/2004 Gat ............................. 219/390
6,855,916 B1 * 2/2005 Matthews et al. .......... 219/390

FOREIGN PATENT DOCUMENTS

EP          1 241 459 A1     9/2002

* cited by examiner

*Primary Examiner*—Walter L Lindsay, Jr.
(74) *Attorney, Agent, or Firm*—Patterson & Sheridan, L.L.P.

(57) ABSTRACT

A system and method for determining the temperature of a semiconductor wafer at the time of thermal contact of the semiconductor wafer with a temperature sensing element. According to the invention, a temperature profile of the temperature sensing element is recorded from the time of thermal contact up to the time of thermal equilibrium between the semiconductor wafer and the temperature sensing element and the temperature of the semiconductor wafer at the time of thermal contact is determined on the basis of a time period between the time of thermal contact and the time of thermal equilibrium and the temperature $T_G$ of the semiconductor wafer reached at the time $t_G$ of thermal equilibrium is determined by back calculation with the aid of an equation derived from Newton's law of cooling.

3 Claims, 4 Drawing Sheets

Recording a temperature profile of the temperature sensing element from the time $t_0$ of thermal contact up to the time $t_G$ of thermal equilibrium between the semiconductor wafer and the temperature sensing element ~21

Determining the temperature $T_0$ of the semiconductor wafer at the time $t_0$ of thermal contact on the basis of the time period $\Delta t$ between the time $t_0$ of thermal contact and the time $t_G$ of thermal equilibrium and the temperature $T_G$ at the time $t_G$ of thermal equilibrium with the aid of the equation $T_0 = T_G * e^{k\Delta t} + T_U * (1 - e^{k\Delta t})$, where the time constant k is calculated with the aid of two temperatures at two times as from the time $t_G$ of thermal equilibrium ~220

FIG. 3

SYSTEM AND METHOD FOR DETERMINING THE TEMPERATURE OF A SEMICONDUCTOR WAFER

CLAIM FOR PRIORITY

This application claims the benefit of priority to German Application No. 103 28 660.8-33, filed in the German language on Jun. 26, 2003, the contents of which are hereby incorporated by reference.

TECHNICAL FIELD OF THE INVENTION

The present invention relates to a system and method for determining the temperature of a semiconductor wafer at the time of thermal contact of the semiconductor wafer with a temperature sensing element.

BACKGROUND OF THE INVENTION

Semiconductor components today dominate a large part of electronics. These components comprise a complex arrangement of electronic structures which are interconnected to one another in a number of planes arranged one above the other on a semiconductor substrate, also referred to as a chip. The production of chips on a semiconductor slice, referred to hereafter as a semiconductor wafer, is characterized by a large number of production steps, which are carried out in different production installations, such as oven installations or plasma etching installations for example. As soon as one production step in one production installation has ended, a semiconductor wafer must be transported to the next installation.

In order to achieve short turnaround times of the semiconductor wafers in production, special transport containers in which a number of semiconductor wafers can be transported at the same time are generally used. So-called FOUP (Front Opening Unified Pod) boxes, which are distinguished by very fast loading and unloading times, have been found to be particularly favorable for this.

However, it is problematical that a semiconductor wafer that is removed from a production installation, and in some cases is at a high temperature, may damage a supporting surface, generally consisting of plastic, when it is deposited into a FOUP box. This is also the case in particular whenever process-related problems in a production installation cause an excessive temperature of a semiconductor wafer, and damage to the supporting surface is consequently brought about. Similar problems may also occur on supporting surfaces in cooling chambers for example.

For this reason, it is endeavored to check the temperatures of the semiconductor wafers that are removed from a production installation at the time when the semiconductor wafers are deposited on the supporting surfaces concerned, in order for example to determine a preceding cooling time within which the semiconductor wafers can cool down below a critical temperature, so that temperature-induced damage to the supporting surfaces can be avoided. Process-related problems in the production installations that cause excessive temperatures of the semiconductor wafers can also be sensed.

For determining the temperature of the semiconductor wafers, use is made of temperature sensing elements, such as thermocouples for example, which are arranged on the sometimes difficult to access supporting surfaces.

However, it is disadvantageous that the temperature at the time when a semiconductor wafer is deposited on a supporting surface, that is the temperature at the time when there is first thermal contact of the semiconductor wafer with a thermocouple, cannot be determined directly, since only the temperature of the thermocouple itself is measured and, in the case of ambient temperature, this is below the temperature of the semiconductor wafer at this time. Only after a time period as from the time of thermal contact, within which the thermocouple heats up and the thermocouple and the semiconductor wafer are at approximately the same temperatures, that is to say as from the time of thermal equilibrium of the thermocouple and the semiconductor wafer, can the temperature of the semiconductor wafer be directly determined with the thermocouple. However, in this time period the semiconductor wafer is already cooling down, so that the elapsed time period leads to a measuring error, which corresponds to the difference between the temperature of the semiconductor wafer at the time of thermal contact and at the time of thermal equilibrium.

Such a measuring error occurs even under optimum conditions, i.e. when there is a relatively great thermal capacity of the semiconductor wafer with respect to the thermocouple and when there is good thermal contact between the semiconductor wafer and the thermocouple, since a certain time period always elapses before the thermocouple is in thermal equilibrium with the semiconductor wafer.

This measuring error can indeed be reduced, by measuring a temperature value after a fixed time period, of for example one second, after the thermal contact of the semiconductor wafer with the thermocouple, and subsequently adding an empirically determined correction value to this temperature value in order to obtain the temperature at the time of the thermal contact of the semiconductor wafer and the thermocouple. However, the problem here is that different thermal couplings between the semiconductor wafer and the thermocouple lead to different correction values, but there is generally insufficient time to check the thermal coupling for each measurement in order to make approximately constant measuring conditions possible, and consequently to use constant correction values. It is also problematical to maintain the fixed time period exactly, so that measuring inaccuracies may in turn arise.

SUMMARY OF THE INVENTION

The present invention provides a method with the aid of which the temperature of a semiconductor wafer can be determined with a high degree of accuracy at the time of thermal contact of the semiconductor wafer with a temperature sensing element.

In one embodiment of the invention, there is a method for determining the temperature of a semiconductor wafer at the time of thermal contact of the semiconductor wafer with a temperature sensing element in which a temperature profile of the temperature sensing element is recorded from the time of thermal contact of the semiconductor wafer with the temperature sensing element up to the time of thermal equilibrium between the semiconductor wafer and the temperature sensing element. Subsequently, the temperature of the semiconductor wafer at the time of thermal contact of the semiconductor wafer with the temperature sensing element is determined on the basis of a time period between the time of thermal contact and the time of thermal equilibrium of the semiconductor wafer and the temperature sensing element and the temperature of the semiconductor wafer reached at the time of thermal equilibrium of the semiconductor wafer and the temperature sensing element is determined by back calculation with the aid of an equation derived from Newton's law of cooling. If the parameters entered in this equation are known, this method makes it possible to determine with a high degree of accuracy the temperature of the semiconductor wafer at the time of thermal contact of the semiconductor wafer with the temperature sensing element.

The time of thermal equilibrium between the semiconductor wafer and the temperature sensing element is preferably determined on the basis of a zero point of the derivative with respect to time of the recorded temperature profile of the temperature sensing element. This zero point corresponds to the time of first thermal equilibrium between the semiconductor wafer and the temperature sensing element, since the temperature profile of the temperature sensing element is characterized by an increase as from the time of thermal contact, by a transit through a maximum at the time of first thermal equilibrium and by a subsequent decrease in the thermal equilibrium corresponding to the temperature of the semiconductor wafer. On the one hand, this allows short measuring times to be achieved, on the other hand the method is simplified, since such a determination of the thermal equilibrium can be carried out independently or automatically by corresponding measuring devices or evaluation devices.

In order to automate the method according to the invention further, the time of thermal contact of the semiconductor wafer and the temperature sensing element is preferably equated with a time of a temperature increase in the temperature profile of the temperature sensing element. This allows the recording of the temperature profile by the temperature sensing element to be triggered by an increase in the temperature of the temperature sensing element, which can be realized very easily, for example with the aid of a triggering element that is sensitive to temperature changes.

In another embodiment of the invention, there is a temperature determining device for a receiving device for receiving a semiconductor wafer which has a temperature sensing element and an evaluation device, the temperature sensing element being designed to record a temperature profile from the time of thermal contact of the semiconductor wafer with the temperature sensing element up to the time of thermal equilibrium between the semiconductor wafer and the temperature sensing element, and the evaluation device being designed to determine the temperature of the semiconductor wafer at the time of thermal contact of the semiconductor wafer with the temperature sensing element on the basis of a time period between the time of thermal contact and the time of thermal equilibrium of the semiconductor wafer and the temperature sensing element and to determine the temperature of the semiconductor wafer reached at the time of thermal equilibrium of the semiconductor wafer and the temperature sensing element by back calculation with the aid of an equation derived from Newton's law of cooling. With the aid of this temperature determining device for a receiving device for receiving a semiconductor wafer, the temperature of the semiconductor wafer can be determined with a high degree of accuracy at the time of thermal contact of the semiconductor wafer with the temperature sensing element.

The temperature determining device preferably has a triggering element, which triggers the recording of the temperature profile by the temperature sensing element as soon as the temperature of the temperature sensing element increases. Such a temperature determining device provides a high degree of operating convenience.

In still another embodiment of the invention, there is a receiving device for a semiconductor wafer with such a temperature determining device, the temperature determining element of which is arranged on a supporting surface of the receiving device that is designed for bearing the semiconductor wafer. The arrangement of the temperature sensing element on the supporting surface produces good thermal coupling between the semiconductor wafer and the temperature sensing element, which is conducive to the accuracy of the determination of the temperature of the semiconductor wafer at the time of thermal contact of the semiconductor wafer with the temperature sensing element.

BRIEF DESCRIPTION OF THE DRAWINGS

The invention is explained in more detail below on the basis of the figures, in which:

FIG. 3 shows a flow diagram of a second embodiment of a method according to the invention for determining the temperature of a semiconductor wafer at the time of thermal contact of the semiconductor wafer with a temperature sensing element.

DETAILED DESCRIPTION OF THE INVENTION

Figure 1:
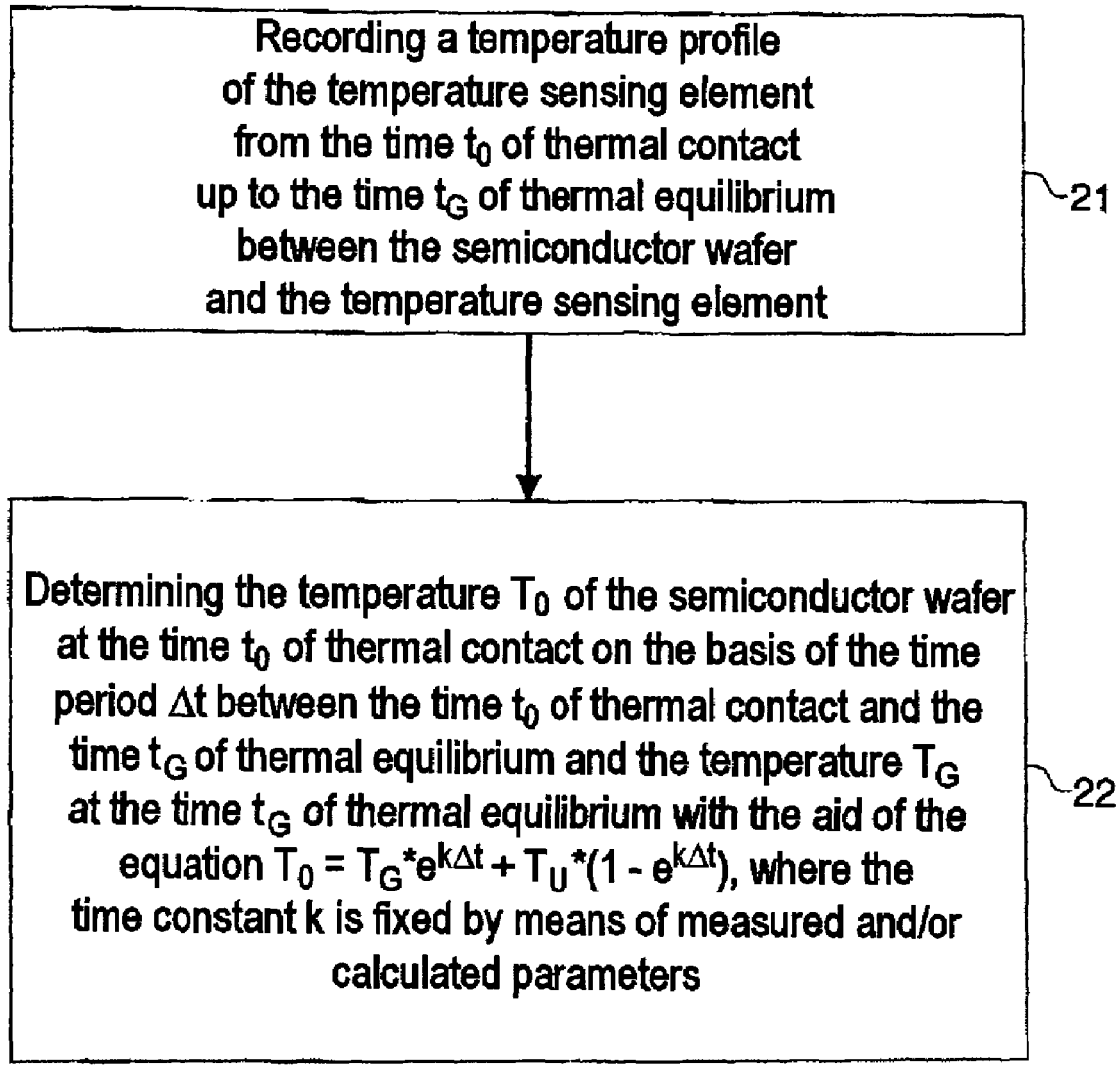
FIG. 1 shows a flow diagram of a first embodiment of a method according to the invention for determining the temperature of a semiconductor wafer at the time of thermal contact of the semiconductor wafer with a temperature sensing element.

FIG. 1 shows a flow diagram of a first embodiment of a method according to the invention for determining the temperature $T_0$ of a semiconductor wafer at the time $t_0$ of thermal contact of the semiconductor wafer with a temperature sensing element, the temperature $T_0$ of the semiconductor wafer at this time $t_0$ lying above the temperature of the temperature sensing element, which is at an ambient temperature $T_U$.

For this purpose, in 21, a temperature profile of the temperature sensing element is recorded from the time to of thermal contact of the semiconductor wafer with the temperature sensing element up to the time $t_G$ of thermal equilibrium between the semiconductor wafer and the temperature sensing element.

Subsequently, in 22, the temperature $T_0$ of the semiconductor wafer at the time $t_0$ of thermal contact of the semiconductor wafer with the temperature sensing element is determined on the basis of a time period $\Delta t$ between the time $t_0$ of thermal contact and the time $t_G$ of thermal equilibrium of the semiconductor wafer and the temperature sensing element and the temperature $T_G$ at the time $t_G$ of thermal equilibrium is determined by back calculation with the aid of the equation $T_0 = T_G * e^{k\Delta t} + T_U * (1 - e^{k\Delta t})$ derived from Newton's law of cooling.

Apart from the temperatures $T_G$ and $T_U$ and the time period $\Delta t = t_G - t_0$, a time constant k of the cooling process of the semiconductor wafer is also entered in this equation. The time constant k, which on the basis of the equation $k=(\alpha*A)/(c*m)$ is dependent on the heat transfer coefficient $\alpha$ of the semiconductor wafer in still air, on the area A of the entire surface of the semiconductor wafer, on the specific heat capacity c and on the mass m of the semiconductor wafer, is hereby fixed by means of measured and/or calculated values of these parameters $\alpha$, A, c and m.

Figure 2:
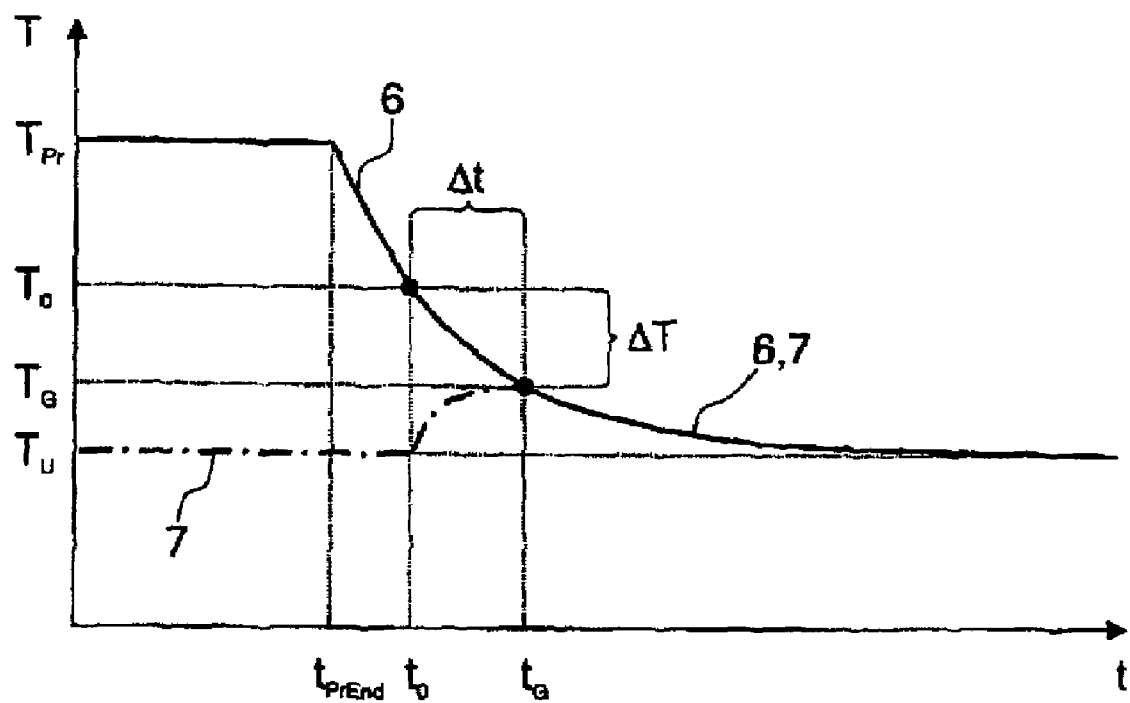
FIG. 2 shows a diagram of the temperature profiles of the semiconductor wafer during the cooling down, and of the temperature sensing element.

To illustrate this method, FIG. 2 shows a diagram of the temperature profiles of the semiconductor wafer during the cooling down and of the temperature sensing element. The temperature profile 6 of the semiconductor wafer is in this case represented by the solid line and the temperature profile 7 of the temperature sensing element is represented by the dash-dotted line.

The semiconductor wafer, which at the beginning is located for example in a process installation, is at first at a high process temperature $T_{Pr}$. As from a time $t_{PrEnd}$, which marks the removal of the semiconductor wafer from the process installation, the semiconductor wafer cools down continuously, in accordance with Newton's law of cooling, to the temperature $T_U$ of the ambience. As from this time $t_{PrEnd}$, this results in an exponential drop with the time constant k in the temperature profile 6 of the semiconductor wafer.

The temperature profile 7 of the temperature sensing element has at the beginning the constant value of the ambient temperature $T_U$. As from the time $t_0$, at which the temperature sensing element thermally contacts the semiconductor wafer, the temperature sensing element warms up, until at the time $t_G$ the semiconductor wafer and the temperature sensing element are at the same temperatures. This time $t_G$ consequently marks the time of first thermal equilibrium between the semiconductor wafer and the temperature sensing element.

Since, as from the time $t_G$, the semiconductor wafer and the temperature sensing element are in thermal equilibrium, the temperature sensing element cools down again continuously, in accordance with the temperature profile 6 of the semiconductor wafer, to the ambient temperature $T_U$, i.e. as from this time $t_G$ the temperature profile 7 of the temperature sensing element coincides with the temperature profile 6 of the semiconductor wafer.

As can be seen on the basis of FIG. 2, in the time period $\Delta t$ between the time $t_0$ of thermal contact and the time $t_G$ of thermal equilibrium, the semiconductor wafer has cooled down from the temperature $T_0$ by the temperature difference $\Delta T$ to the temperature $T_G$.

If the temperature profile 7 of the temperature sensing element from the time $t_0$ of thermal contact up to the time $t_G$ of first thermal equilibrium between the semiconductor wafer and the temperature sensing element is recorded, and the temperature $T_G$ at the time $t_G$ and the time period $\Delta t$ between the times $t_0$ and $t_G$ are determined, it is possible to calculate back to the temperature $T_0$ at the time $t_0$ of thermal contact in a way corresponding to the method according to the invention that is represented in FIG. 1.

An important prerequisite here is that boundary conditions such as the movement of the air, the surface properties of the semiconductor wafer, etc., that influence the parameters $\alpha$, A, c and m determining the time constant k of the cooling process, and consequently influence the time constant k, and also the ambient temperature $T_U$ are constant during the recording time or the time period $\Delta t$, in order to determine the temperature $T_0$ of the semiconductor wafer at the time $t_0$ of thermal contact of the semiconductor wafer with the temperature sensing element with a high degree of accuracy.

On account of the fact that the temperature profile 7 of the temperature sensing element has a maximum at the time $t_G$ of thermal equilibrium, this time $t_G$ and the associated temperature $T_G$ can be determined on the basis of a zero point determination of the derivative with respect to time of the temperature profile. This can be carried out independently or automatically by corresponding measuring devices or evaluation devices, making the method simple. At the same time, short measuring times are also achieved, since, as explained above, the time $t_G$ marks the time of first thermal equilibrium.

Since the temperature sensing element heats up as from the time $t_0$, the method according to the invention can be further automated by triggering the recording of the temperature profile 7 of the temperature sensing element that is carried out in 21 by the increase in the temperature of the temperature sensing element. This can be realized very simply with the aid of a triggering element that is sensitive to temperature changes.

The value of the time constant k that is required for the calculation back to the temperature $T_0$ of the semiconductor wafer at the time $t_0$ of thermal contact is fixed in the case of the method according to the invention that is represented in FIG. 1 with the aid of measured and/or calculated values of the parameters $\alpha$, A, c and m determining the time constant k.

If these parameters $\alpha$, A, c and m are not known or cannot be measured or this would require excessive effort, there are other possibilities for determining the value of the time constant k. In this respect, FIG. 3 shows a flow diagram of a second embodiment of a method according to the invention for determining the temperature $T_0$ of a semiconductor wafer at the time $t_0$ of thermal contact of the semiconductor wafer with a temperature sensing element.

As a difference from the embodiment represented in FIG. 1, in the case of the method according to the invention that is represented in FIG. 3, in 220, the time constant k is calculated from a first temperature value $T_1$ and a second temperature value $T_2$, which are recorded at a first time $t_1$ and a second time $t_2$ as from the time $t_G$ of thermal equilibrium between the semiconductor wafer and the temperature sensing element.

Figure 4:
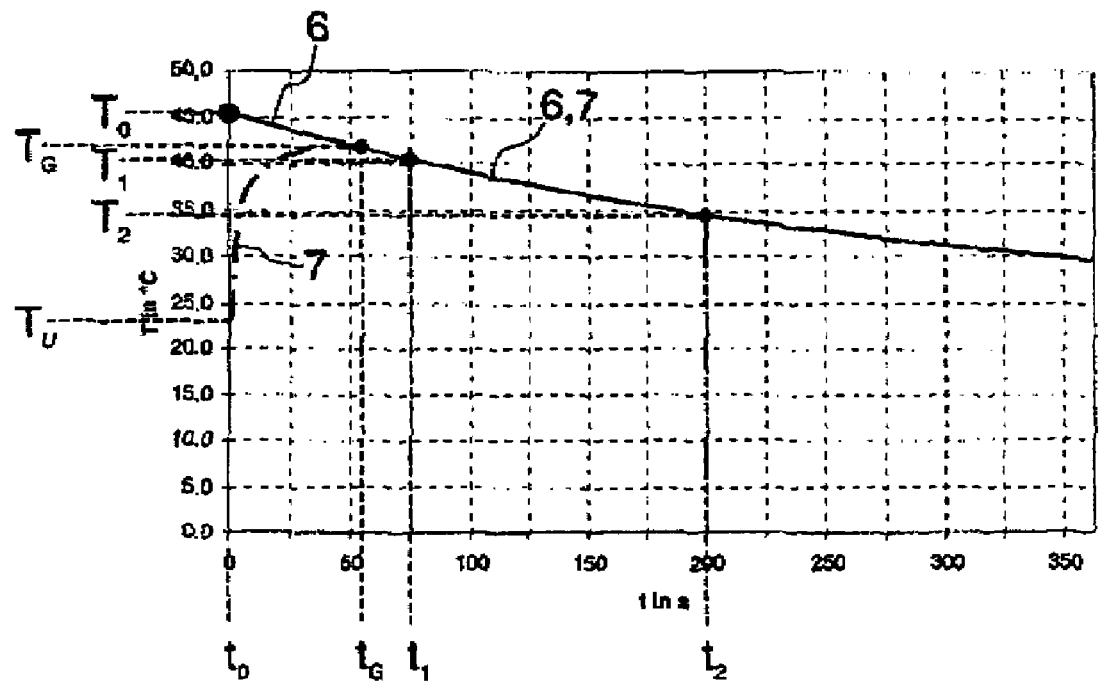
FIG. 4 shows a further diagram of the temperature profiles of the semiconductor wafer during the cooling down, and of the temperature sensing element.

This method is illustrated on the basis of the following FIG. 4, which shows a further diagram of the temperature profiles of the semiconductor wafer during the cooling down and of the temperature sensing element as from the time $t_0$ of thermal contact.

The temperature profile 6 of the semiconductor wafer is in turn characterized by an exponentially falling behavior. The temperature 7 of the temperature sensing element increases as from the time $t_0$ of thermal contact up to the time $t_G$ of thermal equilibrium between the semiconductor wafer and the temperature sensing element and then, as from this time $t_G$, follows the temperature profile 6 of the semiconductor wafer.

The time constant k can be calculated from the temperature values $T_1$ and $T_2$ depicted in FIG. 4 at the respective times $t_1$ and $t_2$ and the ambient temperature $T_U$ by means of the equation $k=-(\ln((T_2-T_U)/(T_1-T_U))/(t_2-t_1))$, which can be derived from Newton's law of cooling, so that it is possible by means of the original equation $T_0=T_G*e^{k\Delta t}+T_U*(1-e^{k\Delta t})$ to calculate back again to the temperature $T_0$ at the time $t_0$ of thermal contact of the semiconductor wafer and the temperature sensing element.

Alternatively, calculating back to the temperature $T_0$ of the semiconduct or wafer at the time $t_0$ of thermal contact may take place by using an arbitrary temperature $T_G'$ as from the time $t_G$ from the recorded temperature profile 7 of the temperature sensing element in the equation $T_0=T_G*e^{k\Delta t}+T_U*(1-e^{k\Delta t})$ instead of the temperature $T_G$ at the time $t_G$ of first thermal equilibrium, that is an arbitrary temperature $T_G'$ at which the semiconductor wafer and the temperature sensing element are in thermal equilibrium. In a corresponding way, the calculation should be carried out on the basis of a time period $\Delta t'$ between the time $t_0$ of first thermal contact and the time $t_G'$ associated with this temperature $T_G'$.

It may be advantageous in this respect to use the temperature $T_1$ and the time $t_1$ or the temperature $T_2$ and the time $t_2$ as the temperature $T_G'$ and as the corresponding time $t_G'$, in order to reduce the number of parameters used for the calculation.

A further alternative is to fix the first time $t_1$ at the time $t_G$ of first thermal equilibrium and correspondingly to fix the first temperature $T_1$ at the temperature $T_G$ of the semiconductor wafer, so that the temperature $T_0$ can be calculated by means of the equation $T_0=T_1*e^{k\Delta t}+T_U*(1-e^{k\Delta t})$ with the time period $\Delta t=t_1-t_0$, whereby a reduction in the number of parameters used is in turn achieved.

Figure 5:
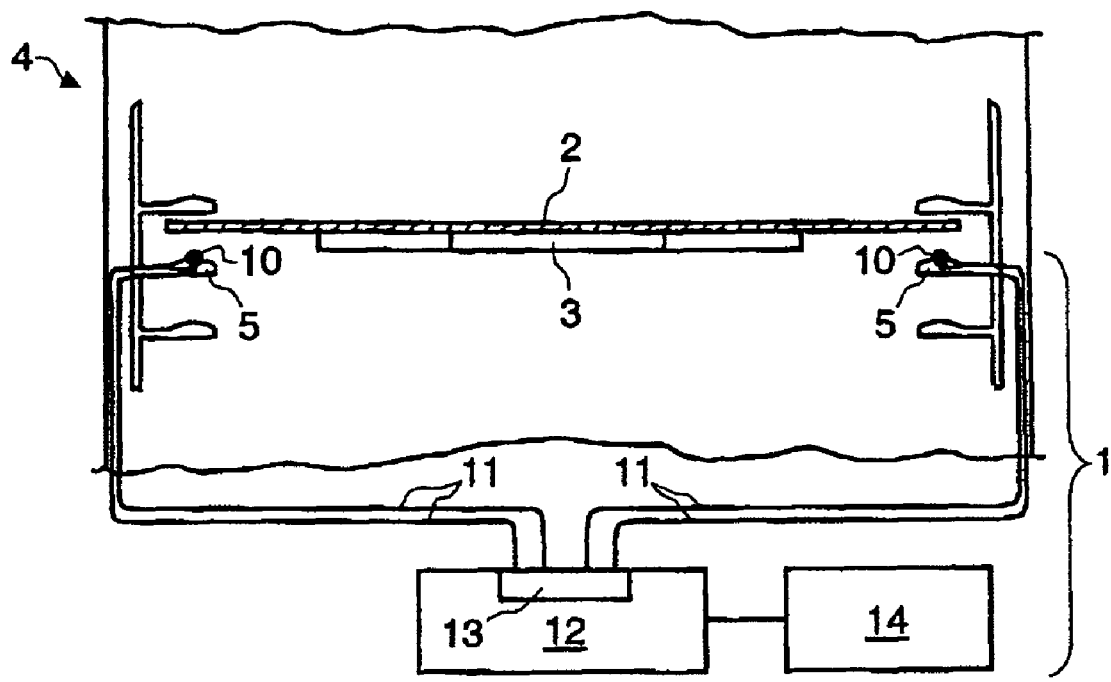
FIGS. 5 and 6 show a schematic representation of a transport container with a temperature determining device in which a semiconductor wafer is deposited.
Figure 6:
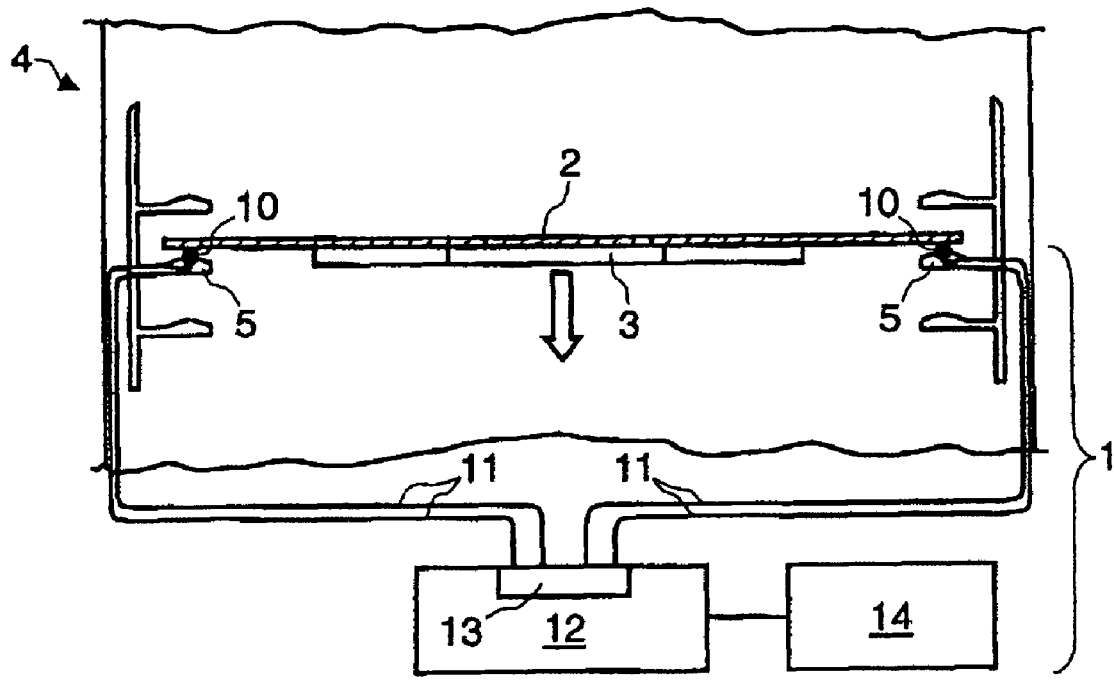

FIGS. 5 and 6 show a schematic representation of a transport container 4 for receiving a number of semiconductor wafers, in which a semiconductor wafer 2 removed from a process installation is deposited with the aid of a holder 3. The transport container 4 is provided with a number of supporting surfaces 5 and a temperature determining device 1, which is designed for determining the temperature of the semiconductor wafer 2 at the time when it is deposited in the transport container 4.

For this purpose, the temperature determining device 1 has two temperature sensing elements, which are designed as thermocouples 10 and are arranged on two mutually opposite supporting surfaces 5 of the transport container 4. The thermocouples 10, with which temperature sensing takes place by means of the thermoelectric Seebeck effect, are distinguished by a low price and can also be arranged at difficult to access points within the transport container 4.

The temperature determining device 1 also has an evaluation device 12, which is electrically connected to the thermocouples 10 by means of leads 11. The evaluation device 12 is designed to determine the temperature $T_0$ of the semiconductor wafer 2 at the time $t_0$ of thermal contact of the semiconductor wafer 2 with the thermocouples 10 in a way corresponding to one of the methods explained above.

The evaluation device 12 is also provided with a triggering element 13 which is sensitive to temperature changes and triggers the recording of the temperature profile by the thermocouples 10 as soon as the temperature of the thermocouples 10 increases. This is the case whenever the wafer 2 removed from the process installation is deposited on the supporting surfaces 5 provided with the thermocouples 10, as represented in FIG. 6.

As from this time, the time $t_0$ of thermal contact of the semiconductor wafer 2 with the thermocouples 10, a temperature profile is recorded by the thermocouples 10 in a way corresponding to one of the methods described above and the temperature $T_0$ of the semiconductor wafer 2 at the time $t_0$ of thermal contact of the semiconductor wafer 2 with the thermocouples 10 is determined by means of the evaluation unit 12.

The temperature determining device 1 also has a display element 14, which is designed to display the temperature $T_0$ of the semiconductor wafer 2 at the time $t_0$ of thermal contact between the semiconductor wafer 2 and the thermocouples 10 that is determined by means of the temperature determining device 1, whereby a high degree of operating convenience is achieved. Further information, such as the current temperature of the thermocouples 10 or the temperature profile of the thermocouples 10 for instance, can also be displayed on the display element 14.

The evaluation device 12 represented in FIGS. 5 and 6 may be realized either as an integral part of the transport container 4 or else as an external unit which is connected to the transport container 4. Furthermore, the triggering element 13 may be realized independently of the evaluation device 12 as a stand-alone unit.

Furthermore, it is possible to design the evaluation device 12 as a computer program of an evaluation computer which is connected to the transport container 4. In the last-mentioned example, there is then the possibility of carrying out the temperature determination "online" during the temperature sensing by the thermocouples 10 or else subsequently "offline".

The temperature determining device 1 represented is also not restricted to use for determining the temperature of a semiconductor wafer when it is deposited in a transport container. This temperature determining device 1 may alternatively also be used at other locations, such as cooling chambers for instance, at which the temperature of a semiconductor wafer is to be determined when it is deposited.

What is claimed is:

1. A temperature determining device for a receiving device for receiving a semiconductor wafer, with a temperature sensing element, which records a temperature profile for a time period from a first point of time of thermal contact of the semiconductor wafer with the temperature sensing element up to a second time of thermal equilibrium between the semiconductor wafer and the temperature sensing element, and with an evaluation device which determines back at the second point of time the temperature of the semiconductor wafer at the first point of time of thermal contact of the semiconductor wafer with the temperature sensing element based on the time period between the first point of time of thermal contact and the second point of time of thermal equilibrium of the semiconductor wafer and the temperature sensing element and based on a temperature of the semiconductor wafer reached at the second point of time of thermal equilibrium of the semiconductor wafer and the temperature sensing element with use of an equation $T_0=T_G*e^{k\Delta t}+T_U*(1-e^{k\Delta t})$, where $T_U$ is an ambient temperature and k is a time constant, the time constant k being determined by an equation $k=(\alpha*A)/(c*m)$, where $\alpha$ corresponds to a heat transfer coefficient of the semiconductor wafer in still air, A corresponds to an area of an entire surface of the semiconductor wafer, c corresponds to a specific heat capacity and m corresponds to a mass of the semiconductor wafer, and a display element, which is designed to display the temperature of the semiconductor wafer at the time of thermal contact between the semiconductor wafer and the temperature sensing element.

2. A temperature determining device for a receiving device for receiving a semiconductor wafer, with a temperature sensing element, which is designed to record a temperature profile from a time of thermal contact of the semiconductor wafer with the temperature sensing element up to a time of thermal equilibrium between the semiconductor wafer and the temperature sensing element, and with an evaluation device which is designed to determine the temperature of the semiconductor wafer at the time of thermal contact of the semiconductor wafer with the temperature sensing element based on a time period between the time of thermal contact and the time of thermal equilibrium of the semiconductor wafer and the temperature sensing element and based on a temperature of the semiconductor wafer reached at the time of thermal equilibrium of the semiconductor wafer and the temperature sensing element with use of an equation $T_0 = T_G * e^{k\Delta t} + T_u * (1 - e^{k\Delta t})$, where $T_u$ is an ambient temperature and k is a time constant, the time constant k being determined by an equation $k = (\alpha * A)/(c * m)$, where a corresponds to a heat transfer coefficient of the semiconductor wafer in still air, A corresponds to an area of an entire surface of the semiconductor wafer, c corresponds to a specific heat capacity and m corresponds to a mass of the semiconductor wafer; and a display element, which is designed to display the temperature of the semiconductor wafer at the time of thermal contact between the semiconductor wafer and the temperature sensing element.

3. A receiving device for a semiconductor wafer with a temperature determining device, comprising a temperature sensing element, which is designed to record a temperature profile from a time of thermal contact of the semiconductor wafer with the temperature sensing element up to a time of thermal equilibrium between the semiconductor wafer and the temperature sensing element, and with an evaluation device which is designed to determine the temperature of the semiconductor wafer at the time of thermal contact of the semiconductor wafer with the temperature sensing element based on a time period between the time of thermal contact and the time of thermal equilibrium of the semiconductor wafer and the temperature sensing element and based on a temperature of the semiconductor wafer reached at the time of thermal equilibrium of the semiconductor wafer and the temperature sensing element with use of an equation $T_0 = T_G * e^{k\Delta t} + T_U * (1 - e_{k\Delta t})$, where $T_u$ is an ambient temperature and k is a time constant, the time constant k being determined by an equation $k = (\alpha * A)/(c * m)$, where a corresponds to a heat transfer coefficient of the semiconductor wafer in still air, A corresponds to an area of an entire surface of the semiconductor wafer, c corresponds to a specific heat capacity and m corresponds to a mass of the semiconductor wafer, the temperature sensing element being arranged on a supporting surface of the receiving device that is designed for bearing the semiconductor wafer; and a display element, which is designed to display the temperature of the semiconductor wafer at the time of thermal contact between the semiconductor wafer and the temperature sensing element.

\* \* \* \* \*